US012689339B2

(12) United States Patent
Huang

(10) Patent No.: US 12,689,339 B2
(45) Date of Patent: Jul. 21, 2026

(54) AMPLIFICATION CIRCUIT

(71) Applicant: REALTEK SEMICONDUCTOR CORPORATION, Hsinchu (TW)

(72) Inventor: Shih-Hsiung Huang, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 557 days.

(21) Appl. No.: 18/360,467

(22) Filed: Jul. 27, 2023

(65) Prior Publication Data

US 2024/0039493 A1 Feb. 1, 2024

(30) Foreign Application Priority Data

Aug. 1, 2022 (TW) .................................. 111128840

(51) Int. Cl.
*H03F 3/45* (2006.01)
(52) U.S. Cl.
CPC ..... *H03F 3/45179* (2013.01); *H03F 3/45636* (2013.01); *H03F 2203/45514* (2013.01); *H03F 2203/45551* (2013.01)
(58) Field of Classification Search
CPC ............. H03F 3/45179; H03F 3/45636; H03F 2203/45514; H03F 2203/45551; H03F 2203/45116; H03F 3/45645; H03F 3/45269
USPC ....................................................... 330/253
See application file for complete search history.

(56) References Cited

U.S. PATENT DOCUMENTS

| | | | |
|---|---|---|---|
| 8,198,937 B1 | 6/2012 | Vilas Boas | |
| 2010/0182176 A1* | 7/2010 | Kawahito | H03M 1/00 |
| | | | 341/172 |
| 2013/0222335 A1* | 8/2013 | Lee | G06F 3/04166 |
| | | | 345/174 |
| 2016/0329881 A1* | 11/2016 | Matsuno | H03F 3/24 |
| 2017/0207760 A1* | 7/2017 | Werking | G01P 15/125 |

* cited by examiner

*Primary Examiner* — Andrea Lindgren Baltzell
*Assistant Examiner* — Jose E Pinero
(74) *Attorney, Agent, or Firm* — WPAT, P.C.; Anthony King

(57) ABSTRACT

The present application discloses an amplification circuit. The amplification circuit includes an amplifier, a feedback unit, a second feedback unit, a first correlated double sampling unit, and a second correlated double sampling unit. The amplifier has a first positive input terminal, a second positive input terminal, a first negative input terminal, a second negative input terminal, a positive output terminal, and a negative output terminal. First terminals of the first feedback unit and the second feedback unit are coupled to the positive output terminal. The first correlated double sampling unit is coupled to the first negative input terminal and a second terminal of the first feedback unit, and performs a sample operation and an output operation. The second correlated double sampling unit is coupled to the second negative input terminal and a second terminal of the second feedback unit, and performs the sample operation and the output operation.

20 Claims, 9 Drawing Sheets

AMPLIFICATION CIRCUIT

CROSS-REFERENCE TO RELATED APPLICATIONS

This application claims priority of Taiwan application No. 111128840, filed on Aug. 1, 2022, which is incorporated by reference in its entirety.

TECHNICAL FIELD

The present application relates to an amplification circuit, particularly to an amplification circuit having the correlated double sampling functionality.

BACKGROUND

For an amplifier composed of stacked transistors, the input voltages of the stacked P-type transistors and N-type transistors may not be designed to be equal in order to have the characteristics of Class AB amplifiers. In other words, different input voltages are required for the stacked P-type transistor and N-type transistor to ensure proper operation. The common approach is to use an alternate current (AC) coupling capacitor coupled between the gates of the stacked P-type transistor and N-type transistor, but this approach will cause multiple capacitors being connected in series on the path of the input signal when using capacitors for correlated double sampling (CDS) to compensate for the offset voltage, resulting in poor offset voltage compensation and reduced overall performance of the amplification circuit.

SUMMARY OF THE INVENTION

One embodiment of the present application discloses an amplification circuit. The amplification circuit includes an amplifier, a first feedback unit, a second feedback unit, a first correlated double sampling unit, and a second correlated double sampling unit. The amplifier has a first positive input terminal, a second positive input terminal, a first negative input terminal, a second negative input terminal and a first output terminal. The first feedback unit has a first terminal coupled to the first output terminal, and a second terminal. The second feedback unit has a first terminal coupled to the first output terminal, and a second terminal. The first correlated double sampling unit includes a first capacitor, a second capacitor, and a first switch set. The first capacitor has a first terminal coupled to the first negative input terminal, and a second terminal. The second capacitor has a first terminal coupled to the second terminal of the first capacitor, and a second terminal. The first switch set is configured to control the electrical connection of the first capacitor and the second capacitor with the second terminal of the first feedback unit, a first common mode voltage, a first negative input signal and a second common mode voltage, to perform a sample operation and an output operation. The second correlated double sampling unit includes a third capacitor, a fourth capacitor, and a second switch set. The third capacitor has a first terminal coupled to the second negative input terminal, and a second terminal. The fourth capacitor has a first terminal coupled to the second terminal of the third capacitor, and a second terminal. The second switch set is configured to control the electrical connection of the third capacitor and the fourth capacitor with the second terminal of the second feedback unit, a third common mode voltage, a second negative input signal and a fourth common mode voltage, to perform the sample operation and the output operation.

Another embodiment of the present application discloses an amplification circuit. The amplification circuit includes an amplifier, a first feedback unit, a second feedback unit, a first correlated double sampling unit, and a second correlated double sampling unit. The amplifier has a first positive input terminal, a second positive input terminal, a first negative input terminal, a second negative input terminal and a first output terminal. The first feedback unit includes a first feedback capacitor, a second feedback capacitor and a first feedback path control unit, wherein the first feedback path control unit is configured to, in a sample operation, has the first feedback capacitor and the second feedback capacitor sample a first negative input signal, and in a prediction operation and an output operation, respectively couple the first feedback capacitor and the second feedback capacitor to a feedback path between the first output terminal and the first negative input terminal. The second feedback unit includes a third feedback capacitor, a fourth feedback capacitor and a second feedback path control unit, wherein the second feedback path control unit is configured to, in the sample operation, has the third feedback capacitor and the fourth feedback capacitor sample a second negative input signal, and in the prediction operation and the output operation, respectively couple the third feedback capacitor and the fourth feedback capacitor to a feedback path between the first output terminal and the second negative input terminal. The first correlated double sampling unit includes a first capacitor, a second capacitor, a third capacitor, and a first switch set. The first capacitor has a first terminal coupled to the first negative input terminal, and a second terminal. The second capacitor has a first terminal and a second terminal. The third capacitor has a first terminal and a second terminal. The first switch set is configured to control the electrical connection of the first capacitor, the second capacitor and the third capacitor with the first feedback unit, a first common mode voltage, the first negative input signal and a second common mode voltage to perform the sample operation, the prediction operation and the output operation. The second correlated double sampling unit includes a fourth capacitor, a fifth capacitor, a sixth capacitor, and a second switch set. The fourth capacitor has a first terminal coupled to the second negative input terminal, and a second terminal. The fifth capacitor has a first terminal and a second terminal. The sixth capacitor has a first terminal and a second terminal. The second switch set is configured to control the electrical connection of the fourth capacitor, the fifth capacitor and the sixth capacitor with the second feedback unit, a third common mode voltage, the second negative input signal and a fourth common mode voltage to perform the sample operation, the prediction operation and the output operation.

DETAILED DESCRIPTION

Figure 1:
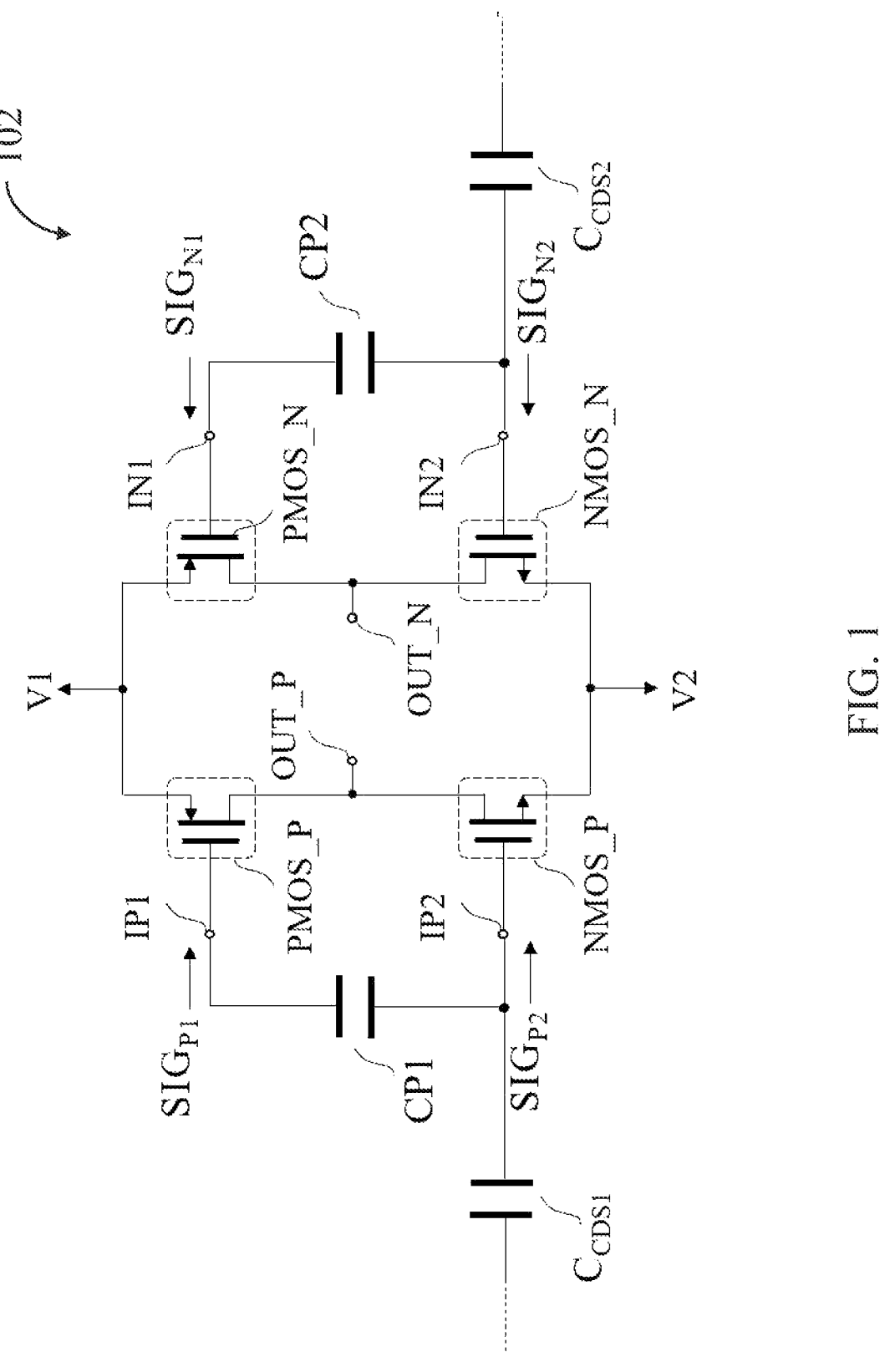
FIG. 1 is a schematic diagram illustrating an amplifier according to one embodiment of the present disclosure.

FIG. 1 is a schematic diagram illustrating an amplifier according to one embodiment of the present disclosure. The amplifier 102 includes a positive terminal P-type transistor PMOS_P, a negative terminal P-type transistor PMOS_N, a positive terminal N-type transistor NMOS_N and a negative terminal N-type transistor NMOS_N. The positive terminal P-type transistor PMOS_P and the positive terminal N-type transistor NMOS_P can be stacked between the reference voltage V1 and the reference voltage V2, and the negative terminal P-type transistor PMOS_N and the negative terminal N-type transistor NMOS_N can be stacked between the reference voltage V1 and the reference voltage V2. In such case, the reference voltage V1 can be, for example, the operation voltage or power supply voltage of the system, and the reference voltage V2 can be, for example, ground voltage of the system.

The positive terminal P-type transistor PMOS_P has a source, a drain and a gate, wherein the drain of the positive terminal P-type transistor PMOS_P can be coupled to the first output terminal OUT_P of the amplifier 102, and the gate of the positive terminal P-type transistor PMOS_P can be coupled to the first positive input terminal IP1 of the amplifier 102. The positive terminal N-type transistor NMOS_P has a source, a drain and a gate, wherein the drain of the positive terminal N-type transistor NMOS_P can be coupled to the drain of the positive terminal P-type transistor PMOS_P, and the gate of the positive terminal N-type transistor NMOS_P can be coupled to the second positive input terminal IP2 of the amplifier 102.

The negative terminal P-type transistor PMOS_N has a source, a drain and a gate, wherein the drain of the negative terminal P-type transistor PMOS_N can be coupled to the second output terminal OUT_N of the amplifier 102, and the gate of the negative terminal P-type transistor PMOS_N can be coupled to the first negative input terminal IN1 of the amplifier 102. The negative terminal N-type transistor NMOS_N has a source, a drain and a gate, wherein the drain of the negative terminal N-type transistor NMOS_N can be coupled to the drain of the negative terminal P-type transistor PMOS_N, and the gate of the negative terminal N-type transistor NMOS_N can be coupled to the second negative input terminal IN2 of the amplifier 102. In the present embodiment, the first output terminal OUT_P can be the positive output terminal of the amplifier 102, and the second output terminal OUT_N can be the negative output terminal of the amplifier 102.

In the present embodiment, the first positive input terminal IP1 and the first negative input terminal IN1 of the amplifier 102 can receive a pair of differential input signals $SIG_{P1}$ and $SIG_{N1}$, and the second positive input terminal IP2 and the second negative input terminal IN2 can receive a pair of differential input signals $SIG_{P2}$ and $SIG_{N2}$, wherein differential input signals $SIG_{P1}$ and $SIG_{N1}$ and differential input signals $SIG_{P2}$ and $SIG_{N2}$ can carry the same AC signal, however, the common mode voltage of the differential input signals $SIG_{P1}$ and $SIG_{N1}$ and the common mode voltage of differential input signals $SIG_{P2}$ and $SIG_{N2}$ can be different.

In FIG. 1, an AC coupling capacitor CP1 is further disposed between the first positive input terminal IP1 and the second positive input terminal IP2, and an AC coupling capacitor CP2 is further disposed between the first negative input terminal IN1 and the second negative input terminal IN2. In such case, the amplifier 102 can, for example, only receive the differential input signals $SIG_{P2}$ and $SIG_{N2}$ required by the positive terminal N-type transistor NMOS_P and the negative terminal N-type transistor NMOS_N, and can generate the differential input signals $SIG_{P1}$ and $SIG_{N1}$ required by the positive terminal P-type transistor PMOS_P and the negative terminal P-type transistor PMOS_N via the bias of the AC coupling capacitors CP1 and CP2.

However, in such case, correlated double sampling capacitors $C_{CDS1}$ and $C_{CDS2}$, which are disposed outside of the amplifier 102 and configured to sample and compensate the offset voltage of the amplifier 102, may be directly connected in series with the coupling capacitors CP1 and CP2, thereby causing the charges to be transferred between the two types of capacitors, and thus the offset voltage cannot be compensated effectively, or the performance of the amplifier 102 may be reduced.

Figure 2:
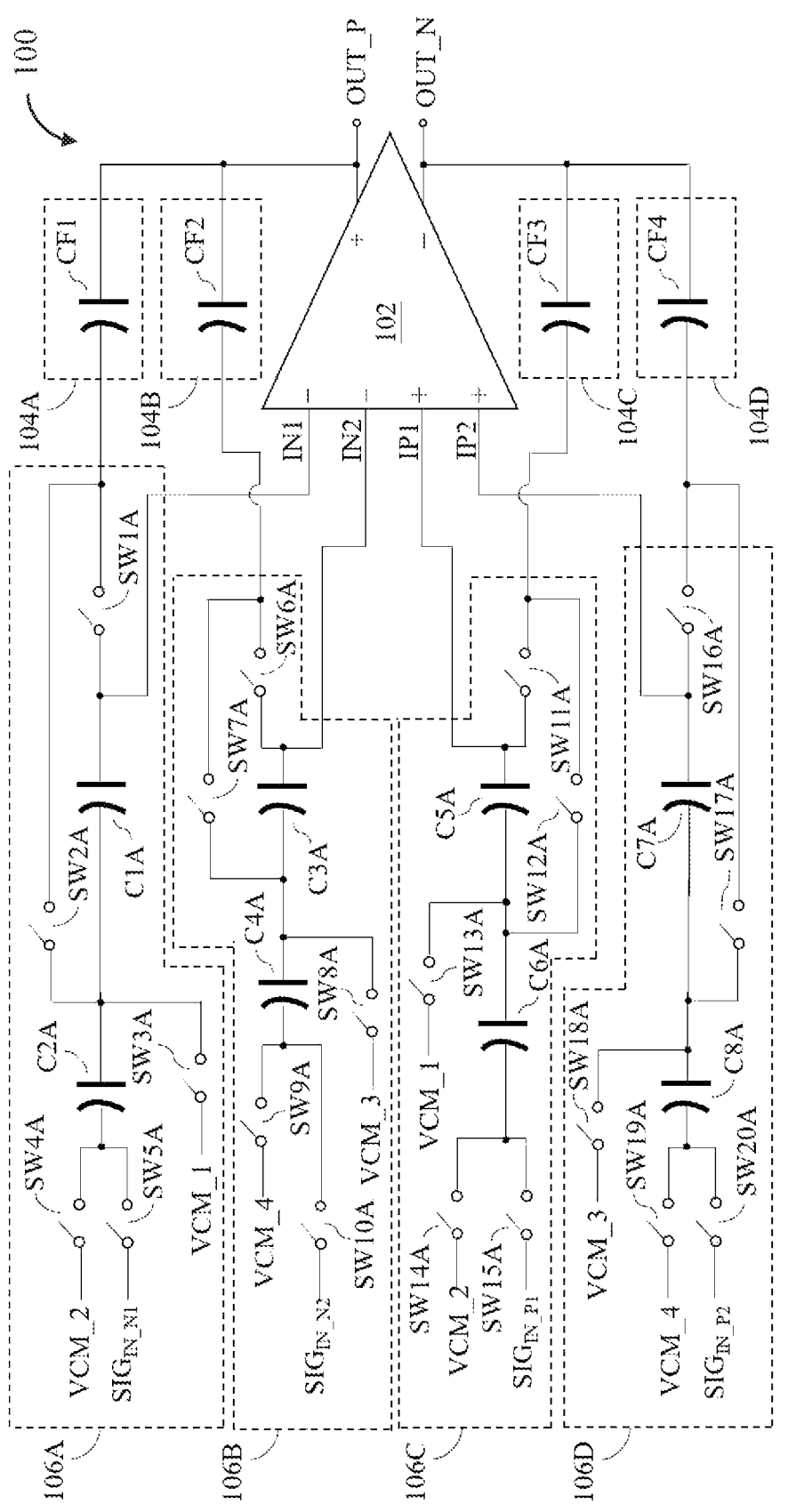
FIG. 2 is a schematic diagram illustrating an amplification circuit according to one embodiment of the present disclosure.

FIG. 2 is a schematic diagram illustrating an amplification circuit according to one embodiment of the present disclosure. As shown in FIG. 2, the amplification circuit 100 can include an amplifier 102, a feedback unit 104A, a feedback unit 104B, a feedback unit 104C, a feedback unit 104D, a correlated double sampling unit 106A, a correlated double sampling unit 106B, a correlated double sampling unit 106C and a correlated double sampling unit 106D.

In the present embodiment, the first negative input terminal IN1, the second negative input terminal IN2, the first positive input terminal IP1 and the second positive input terminal IP2 of the amplifier 102 can be coupled to the correlated double sampling unit 106A, the correlated double sampling unit 106B, the correlated double sampling unit 106C and the correlated double sampling unit 106D respectively, and can receive corresponding input signals via the correlated double sampling unit 106A, the correlated double sampling unit 106B, the correlated double sampling unit 106C and the correlated double sampling unit 106D. In other words, the amplification circuit 100 can omit the coupling capacitors CP1 and CP2 shown in FIG. 1, and instead, provide the corresponding correlated double sampling unit 106A, the correlated double sampling unit 106B, the correlated double sampling unit 106C and the correlated double sampling unit 106D at the first negative input terminal IN1, the second negative input terminal IN2, the first positive input terminal IP1 and the second positive input terminal IP2 of the amplifier 102 respectively, so as to avoid the situation where capacitors are connected in series on the same signal path; therefore, the offset voltage can be compensated more effectively and the performance of the amplifier 102 can be improved.

As shown in FIG. 2, the feedback unit 104A has a first terminal and a second terminal, the first terminal of the feedback unit 104A can be coupled to the first output terminal OUT_P. The first the correlated double sampling unit 106A can include a capacitor C1A, a capacitor C2A and a first switch set. The capacitor C1A has a first terminal and a second terminal, wherein the first terminal of the capacitor C1A can be coupled to the first negative input terminal IN1; the capacitor C2A has a first terminal and a second terminal, wherein the first terminal of the capacitor C2A can be coupled to the second terminal of the capacitor C1A. The first switch set can be configured to control the electrical connection of the capacitor C1A and the capacitor C2A with the second terminal of the feedback unit 104A, the first common mode voltage VCM_1, the first the negative input signal $SIG_{IN\_N1}$ and the second common mode voltage VCM_2 to perform the sample operation and the output operation.

Similarly, the feedback unit 104B has a first terminal and a second terminal, the first terminal of the feedback unit 104B can be coupled to the first output terminal OUT_P. The correlated double sampling unit 106B can include a capacitor C3A, a capacitor C4A and a second switch set. The capacitor C3A has a first terminal and a second terminal, wherein the first terminal of the capacitor C3A can be coupled to the second negative input terminal IN2; the capacitor C4A has a first terminal and a second terminal, wherein the first terminal of the capacitor C4A can be coupled to the second terminal of the capacitor C3A. The second switch set can control the electrical connection of the capacitor C3A and the capacitor C4A with the second terminal of feedback unit 106B, the third common mode voltage VCM_3, the second negative input signal $SIG_{IN\_N2}$ and the fourth common mode voltage VCM_4 to perform the sample operation and the output operation.

Further, the feedback unit 104C can have a first terminal and a second terminal, wherein the first terminal of the feedback unit 104C can be coupled to the second output terminal OUT_N; the feedback unit 104D has a first terminal and a second terminal, wherein the first terminal of the feedback unit 104D can be coupled to the second output terminal OUT_N. In the present embodiment, the feedback unit 104A can include a feedback capacitor CF1, the feedback unit 104B can include a feedback capacitor CF2, the feedback unit 104C can include a feedback capacitor CF3, and the feedback unit 104D can include a feedback capacitor CF4.

The correlated double sampling unit 106C can include a capacitor C5A, a capacitor C6A and a third switch set. The capacitor C5A has a first terminal and a second terminal, wherein the first terminal of the capacitor C5A can be coupled to the first positive input terminal IP1; the capacitor C6A has a first terminal and a second terminal, wherein the first terminal of the capacitor C6A can be coupled to the second terminal of the capacitor C5A. The third switch set can control the electrical connection of the capacitor C5A and the capacitor C6A with the second terminal of the feedback unit 106C, the first common mode voltage VCM_1, the first positive input signal $SIG_{IN\_P1}$ and the second common mode voltage VCM_2 to perform the sample operation and the output operation.

The correlated double sampling unit 106D can include a capacitor C7A, a capacitor C8A and a fourth switch set. The capacitor C7A has a first terminal and a second terminal, wherein the first terminal of the capacitor C7A can be coupled to the second positive input terminal IP2; the capacitor C8A has a first terminal and a second terminal, wherein the first terminal of the capacitor C8A can be coupled to the second terminal of the capacitor C7A. The fourth switch set can control the electrical connection of the capacitor C7A and the capacitor C8A with the second terminal of the feedback unit 106D, the third common mode voltage VCM_3, the second positive input signal $SIG_{IN\_P2}$ and the fourth common mode voltage VCM_4 to perform the sample operation and the output operation.

In the present embodiment, the first common mode voltage VCM_1 can be greater than the third common mode voltage VCM_3, and the second common mode voltage VCM_2 can be greater than the fourth common mode voltage VCM_4. Moreover, the second common mode voltage VCM_2 can be the common mode voltage of the first positive input signal $SIG_{IN\_P1}$ and the first the negative input signal $SIG_{IN\_N1}$, and the fourth common mode voltage VCM_4 can be the common mode voltage of the second positive input signal $SIG_{IN\_P2}$ and the second negative input signal $SIG_{IN\_N2}$. In certain embodiments, the first the negative input signal $SIG_{IN\_N1}$ and the second negative input signal $SIG_{IN\_N2}$ can have the same value, and the first positive input signal $SIG_{IN\_P1}$ and the second positive input signal $SIG_{IN\_P2}$ can have the same value; however, the present disclosure is not limited thereto.

The amplification circuit 100 can control the coupling relationship of the capacitors C1A, C2A, C3A and C4A with other components via the first switch set and the second switch set so that the capacitors C1A, C2A, C3A and C4A receive the corresponding voltages, thereby completing the operation of the correlated double sampling.

Figure 3:
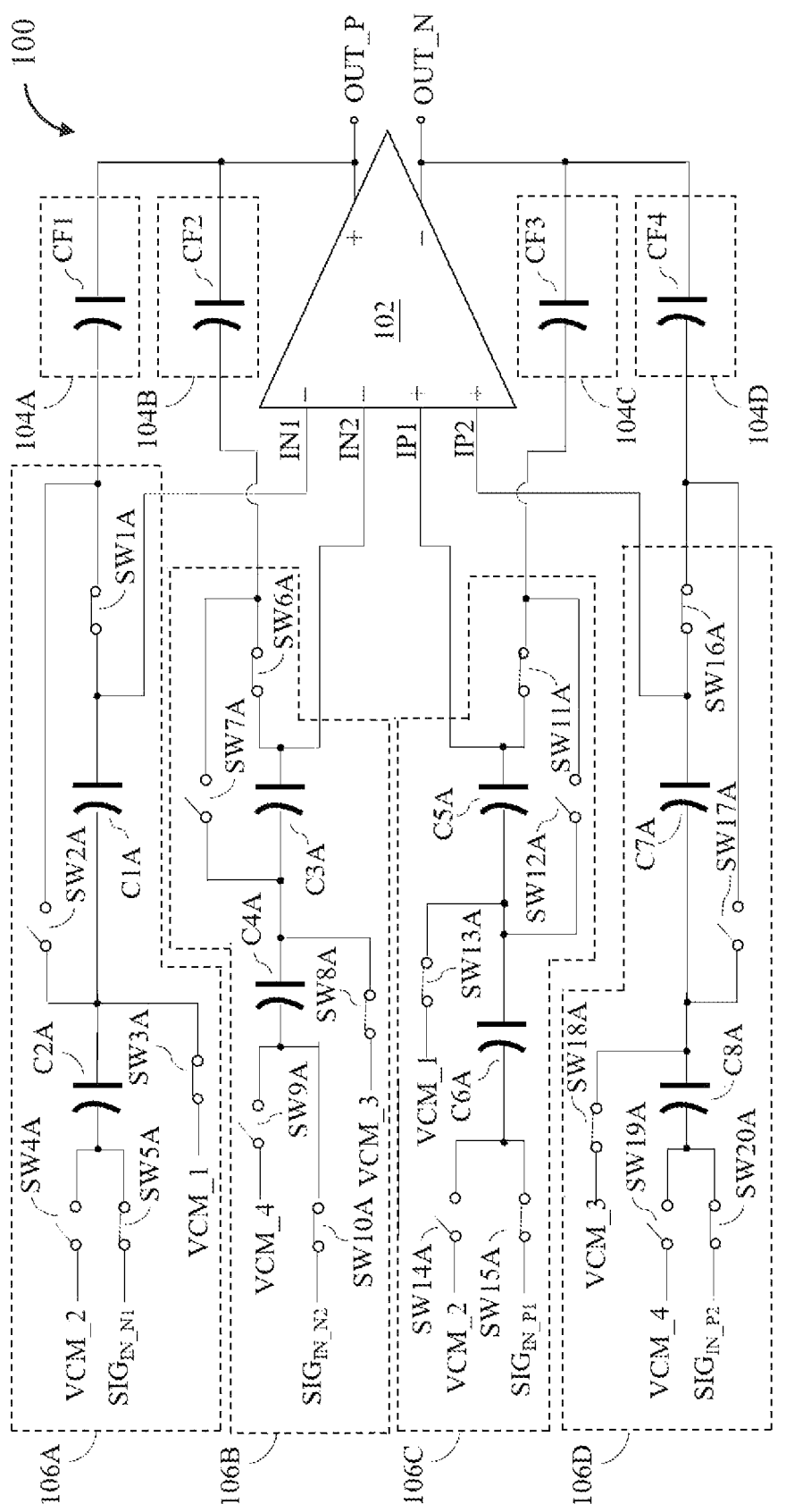
FIG. 3 is a schematic diagram illustrating the amplification circuit of FIG. 2 during a sample operation.
Figure 4:
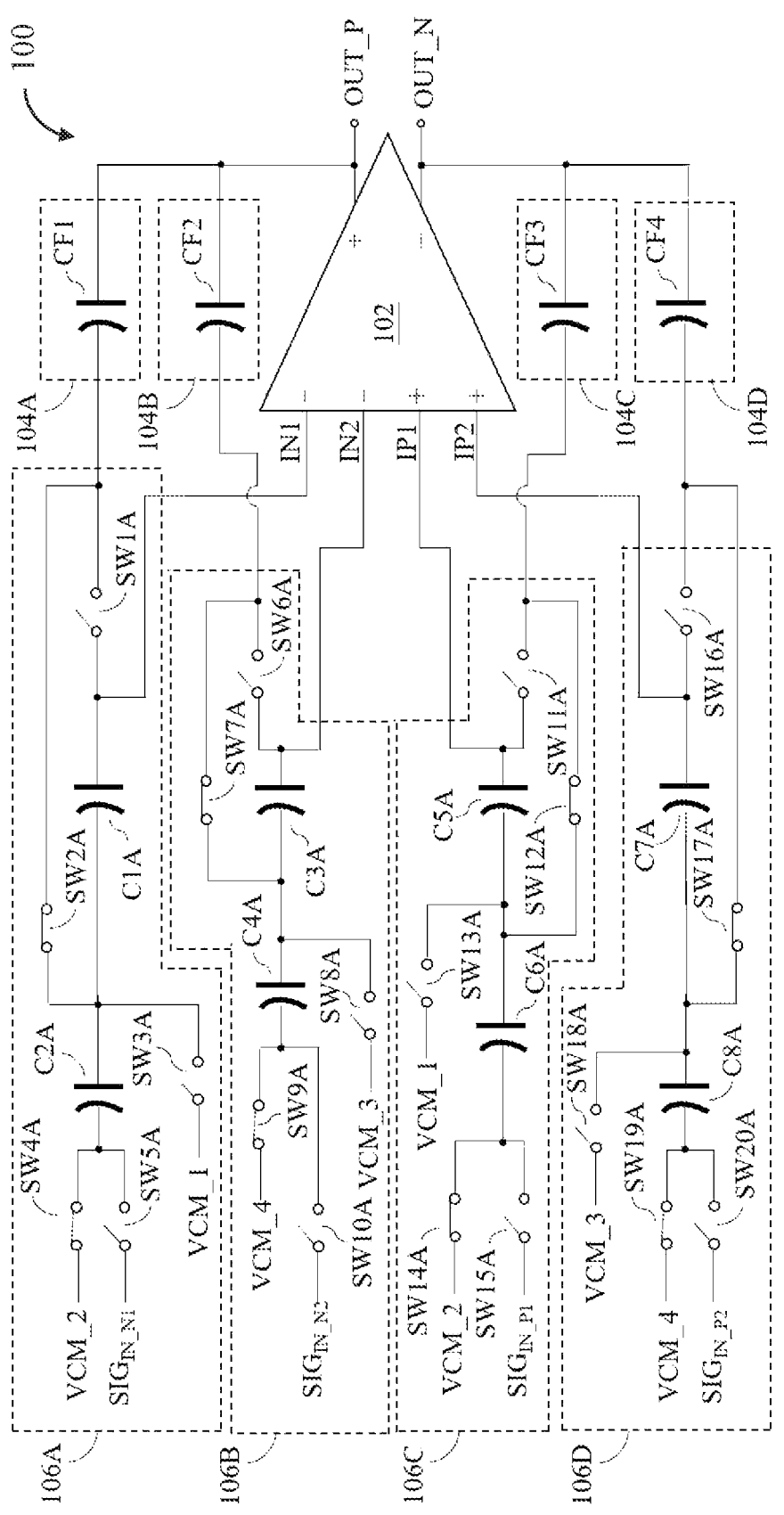
FIG. 4 is a schematic diagram illustrating the amplification circuit of FIG. 2 during an output operation.

FIG. 3 is a schematic diagram illustrating the amplification circuit 100 when performing the sample operation, and FIG. 4 is a schematic diagram illustrating the amplification circuit 100 when performing the output operation.

As shown in FIG. 3, during the sample operation, the first switch set can couple the first terminal of the capacitor C1A to the second terminal of the feedback unit 104A, couple the second terminal of the capacitor C1A to the first common mode voltage VCM_1, and have the second terminal of the capacitor C2A receive the first the negative input signal $SIG_{IN\_N1}$; the second switch set can couple the first terminal of the capacitor C3A to the second terminal of the feedback unit 104B, couple the second terminal of the capacitor C3A to the third common mode voltage VCM_3, and have the second terminal of the capacitor C4A receive the second negative input signal $SIG_{IN\_N2}$. In the sample operation, the capacitors C1A and C3A can sample the offset voltage of the amplifier 102, and the capacitors C2A and C4A can sample on input signals $SIG_{IN\_N1}$ and $SIG_{IN\_N2}$.

As shown in FIG. 4, in the output operation after the completion of the sample operation, the first switch set can disconnect the first terminal of the capacitor C1A and the second terminal of the feedback unit 104A, couple the second terminal of the capacitor C1A to the second terminal of the feedback unit 104A, and have the second terminal of the capacitor C2A receive the second common mode voltage VCM_2; the second switch set can disconnect the first terminal of the capacitor C3A and the second terminal of the feedback unit 104B, couple the second terminal of the capacitor C3A to the second terminal of the feedback unit 104B, and have the second terminal of the capacitor C4A receive the fourth common mode voltage VCM_4. In the output operation, the second terminal of the feedback unit 104A is changed to be coupled to the second terminal of the capacitor C1A, and the second terminal of the feedback unit 104B is changed to be coupled to the second terminal of the capacitor C3A; in such case, the bias voltages sampled by the capacitors C1A and C3A during the sample operation can be used for compensation of the amplifier 102, thereby improving the performance of the amplifier 102 in amplifying signals.

Similarly, the third switch set can control the capacitors C5A and C6A according to the same principles to perform the sample operation and the output operation, and the fourth switch set control the capacitors C7A and C8A according to the same principles to perform the sample operation and the output operation.

Moreover, in the present embodiment, the first switch set, the second switch set, the third switch set and the fourth switch set can have same structures. Take the first switch set for example, as shown in FIG. 2, the first switch set can include a switch SW1A, a switch SW2A, a switch SW3A, a switch SW4A and a switch SW5A. The switch SW1A has a first terminal and a second terminal, wherein the first terminal of the switch SW1A can be coupled to the first terminal of the capacitor C1A, and the second terminal of the switch SW1A can be coupled to the second terminal of the feedback unit 104A. The switch SW2A has a first terminal and a second terminal, wherein the first terminal of the switch SW2A can be coupled to the second terminal of the capacitor C1A, and the second terminal of the switch SW2A can be coupled to the second terminal of the feedback unit 104A. The switch SW3A has a first terminal and a second terminal, wherein the first terminal of the switch SW3A can be coupled to the second terminal of the capacitor C1A, and the second terminal of the switch SW3A can be coupled to the first common mode voltage VCM_1. The switch SW4A has a first terminal and a second terminal, wherein the first terminal of the switch SW4A can be coupled to the second terminal of the capacitor C2A, and the second terminal of the switch SW4A can be coupled to the second common mode voltage VCM_2. The switch SW5A has a first terminal and a second terminal, wherein the first terminal of the switch SW5A can be coupled to the second terminal of the capacitor C2A, and the second terminal of the switch SW5A can be coupled to first negative input voltage $SIG_{IN\_N1}$.

Figure 5:
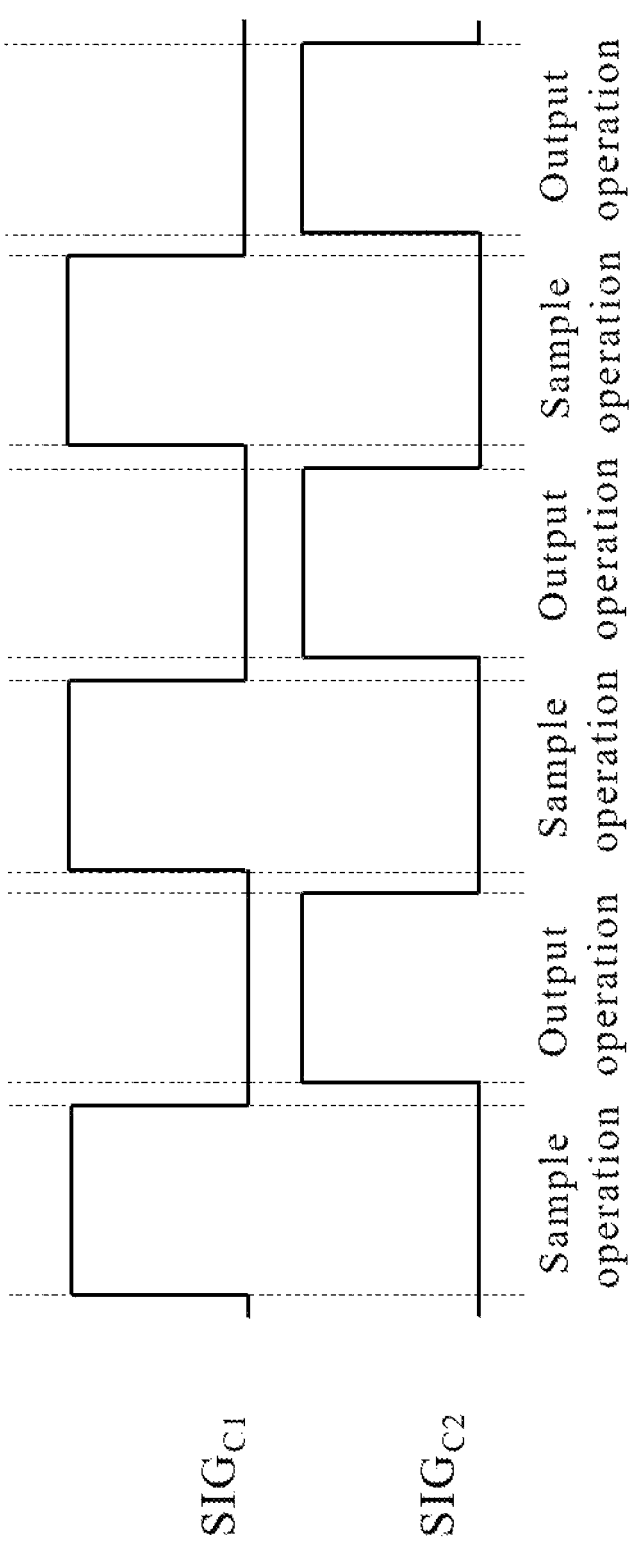
FIG. 5 is a timing diagram of a control signal of the first switch set of a correlated double sampling unit of FIG. 2.

FIG. 5 is a timing diagram of the control signals of the first switch set of the correlated double sampling unit 106A. In FIG. 5, the control signal $SIG_{C1}$ can be configured to control the switches SW1A, SW3A and SW5A, and the control signal $SIG_{C2}$ can be configured to control the switches SW2A and SW4A. For example, when the control signal $SIG_{C1}$ has a high voltage, the switches SW1A, SW3A and SW5A can be turned on, and when the control signal $SIG_{C1}$ has a low voltage, the switches SW1A, SW3A and SW5A can be turned off. Moreover, when the control signal $SIG_{C2}$ has a high voltage, the switches SW2A and SW4A can be turned on, and when the control signal $SIG_{C2}$ has a low voltage, the switches SW2A and SW4A can be turned off.

In such case, in the sample operation, as shown in FIG. 3, the switch SW1A, the switch SW3A and the switch SW5A are turned on, and the switch SW2A and the switch SW4A are turned off; in the output operation, as shown in FIG. 4, the switch the switch SW3A and the switch SW5A are turned off, and the switch SW2A and the switch SW4A are turned on.

Similarly, the second switch set can include a switch SW6A, a switch SW7A, a switch SW8A, a switch SW9A and a switch SW10A, the third switch set can include a switch SW11A, a switch SW12A, a switch SW13A, a switch SW14A and a switch SW15A, and the fourth switch set can include a switch SW16A, a switch SW17A, a switch SW18A, a switch SW19A and a switch SW20A. In the present embodiment, the control signal $SIG_{C1}$ of FIG. 5 can also be configured to control the switches SW6A, SW8A, SW10A, SW11A, SW13A, SW15A, SW16A, SW18A and SW20A, and the control signal $SIG_{C2}$ can be configured to control the switches SW7A, SW9A, SW12A, SW14A, SW17A and SW19A.

In such case, in the sample operation, as shown in FIG. 3, the switch SW6A, the switch SW8A, the switch SW10A, the switch SW11A, the switch SW13A, the switch SW15A, the switch SW16A, the switch SW18A and the switch SW20A are turned on, and the switch SW7A, the switch SW9A, the switch SW12A, the switch SW14A, the switch SW17A and the switch SW19A are turned off. Moreover, in the output operation, as shown in FIG. 4, the switch SW6A, the switch SW8A, the switch SW10A, the switch SW11A, the switch SW13A, the switch SW15A, the switch SW16A, the switch SW18A and the switch SW20A are turned off, and the switch SW7A, the switch SW9A, the switch SW12A, the switch SW14A, the switch SW17A and the switch SW19A are turned on.

In the embodiment of FIG. 2, the amplification circuit 100 can include four feedback units 104A, 104B, 104C and 104D and four correlated double sampling units 106A, 106B, 106C and 106D; however, the present disclosure is not limited there to, and in some other embodiments, the amplifier 102 can be further coupled to a single-ended conversion circuit to change the double-ended output to a single-ended output. In such case, the amplification circuit 100 can sample and compensate the bias via only the first negative input terminal IN1 and the second negative input terminal IN2 depending on the needs, and can omit the feedback units 104C, 104D and the correlated double sampling units 106C and 106D.

Figure 6:
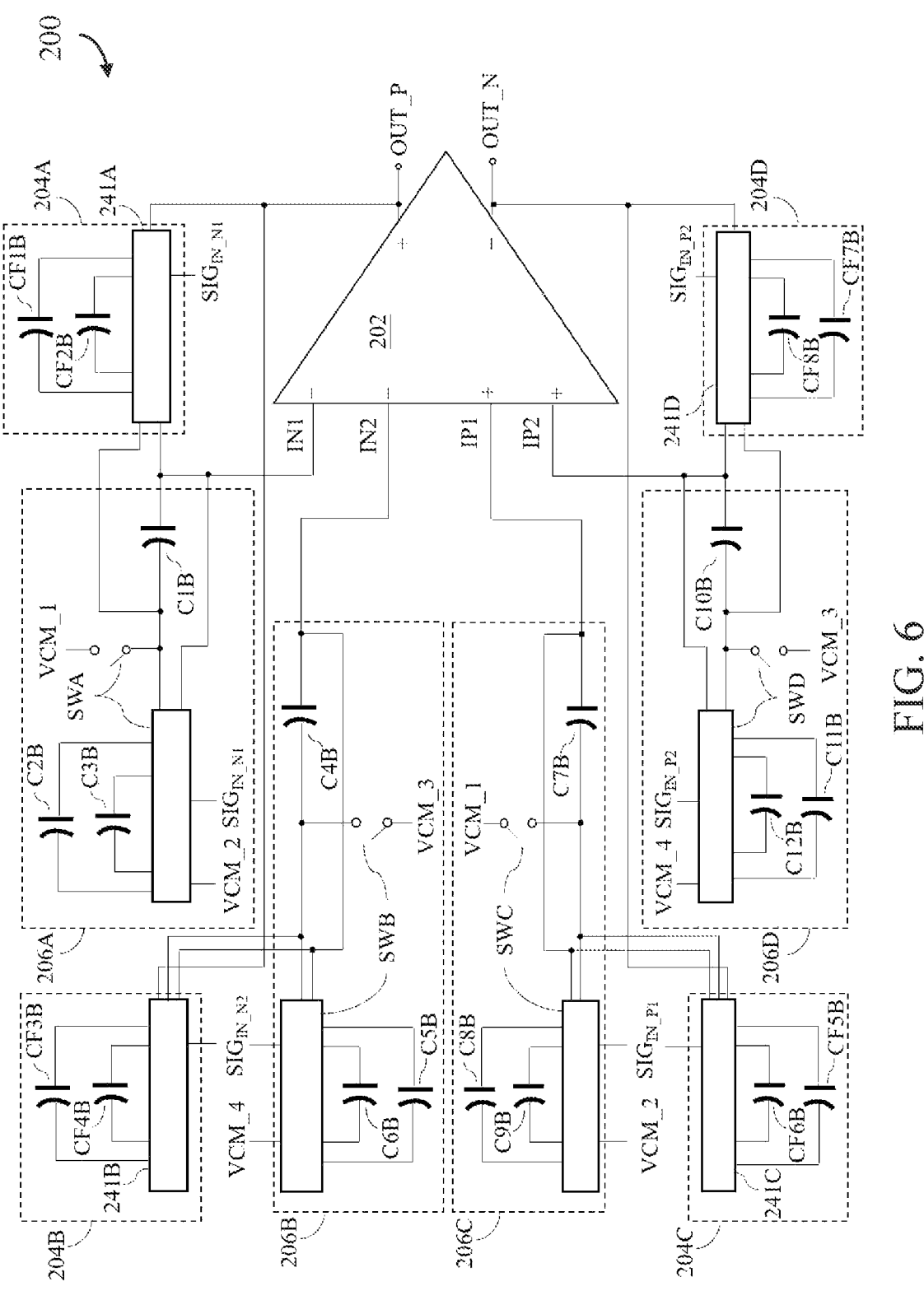
FIG. 6 is a schematic diagram illustrating an amplification circuit according to another embodiment of the present disclosure.

FIG. 6 is a schematic diagram illustrating an amplification circuit according to another embodiment of the present disclosure. As shown in FIG. 6, the amplification circuit 200 can include an amplifier 202, a feedback unit 204A, a feedback unit 204B, a feedback unit 204C, a feedback unit 204D, a correlated double sampling unit 206A, a correlated double sampling unit 206B, a correlated double sampling unit 206C and a correlated double sampling unit 206D.

In the present embodiment, the amplifier 202 can have substantially the same structure with the amplifier 102, and the first negative input terminal IN1, the second negative input terminal IN2, the first positive input terminal IP1 and the second positive input terminal IP2 of the amplifier 202 can be coupled to the correlated double sampling unit 206A, the correlated double sampling unit 206B, the correlated double sampling unit 206C and the correlated double sampling unit 206D respectively, and can receive corresponding input signals via the correlated double sampling unit 206A, the correlated double sampling unit 206B, the correlated double sampling unit 206C and the correlated double sampling unit 206D. In other words, the amplification circuit 200 can also omit the coupling capacitors CP1 and CP2 shown in FIG. 1; instead, the amplification circuit can provide the corresponding correlated double sampling unit 206A, correlated double sampling unit 206B, correlated double sampling unit 206C and correlated double sampling unit 206D at the first negative input terminal IN1, the second negative input terminal IN2, the first positive input terminal IP1 and the second positive input terminal IP2 of the amplifier 202 respectively, thereby avoiding the situation where capacitors are connected in series on the same signal path, so as to compensate the offset voltage more effectively and help to improve the performance of the amplifier 202.

As shown in FIG. 6, the feedback unit 204A can include a feedback capacitor CF1B, a feedback capacitor CF2B and a feedback path control unit 241A. The feedback path control unit 241A can allow the feedback capacitor CF1B and the feedback capacitor CF2B to sample the negative input signal $SIG_{IN\_N1}$ in a sample operation, couple the feedback capacitor CF1B to a feedback path between an output terminal OUT_P and a negative input terminal IN1 in a prediction operation, and couple the feedback capacitor CF1B and the feedback capacitor CF2B to the feedback path between an output terminal OUT_P and a negative input terminal IN1 in an output operation.

The correlated double sampling unit 206A includes a capacitor C1B, a capacitor C2B, a capacitor C3B and a switch set SWA. The capacitor C1B has a first terminal and a second terminal, wherein the first terminal of the capacitor C1B is coupled to the first negative input terminal IN1. The capacitor C2B has a first terminal and a second terminal, and the capacitor C3B has a first terminal and a second terminal. The switch set SWA can be configured to control the electrical connection of the capacitor C1B, the capacitor C2B and the capacitor C3B with the feedback unit 204A, the first common mode voltage VCM_1, the first the negative input signal $SIG_{IN\_N1}$ and the second common mode voltage VCM_2 to perform the sample operation, the prediction operation and the output operation.

The feedback unit 204B includes a feedback capacitor CF3B, a feedback capacitor CF4B and a feedback path control unit 241B. The feedback path control unit 241B can, in the sample operation, allow the feedback capacitor CF3B and the feedback capacitor CF4B to sample the second negative input signal $SIG_{IN\_N2}$, couple the feedback capacitor CF3B to a feedback path between the first output terminal OUT_P and the second negative input terminal IN2 in the prediction operation, and couple the feedback capacitor CF4B to the feedback path between the first output terminal OUT_P and the second negative input terminal IN2 in the output operation.

The correlated double sampling unit 206B includes a capacitor C4B, a capacitor C5B, a capacitor C6B and a switch set SWB. The capacitor C4B has a first terminal and a second terminal, wherein the first terminal of the capacitor C4B is coupled to the second negative input terminal IN2. The capacitor C5B has a first terminal and a second terminal, and the capacitor C6B has a first terminal and a second terminal. The switch set SWB can control the electrical connection of the capacitor C4B, the capacitor C5B and the capacitor C6B with the feedback unit 204B, the third common mode voltage VCM_3, the second negative input signal $SIG_{IN\_N2}$ and the fourth common mode voltage VCM_4 to perform the sample operation, the prediction operation and the output operation.

Moreover, the feedback unit 204C can include a feedback capacitor CF5B, a feedback capacitor CF6B and a feedback path control unit 241C. The feedback path control unit 241C can, in the sample operation, allow the feedback capacitor CF5B and the feedback capacitor CF6B to sample the first positive input signal $SIG_{IN\_P1}$, couple the feedback capacitor CF5B to a feedback path between the second output terminal OUT_N and the first positive input terminal IP1 in the prediction operation, and couple the feedback capacitor CF6B to the feedback path between the second output terminal OUT_N and the first positive input terminal IP1 in the output operation.

The correlated double sampling unit 206C includes a capacitor C7B, a capacitor C8B, a capacitor C9B and a switch set SWC. The capacitor C7B has a first terminal and a second terminal, wherein the first terminal of the capacitor C7B is coupled to the first positive input terminal IP1. The capacitor C8B has a first terminal and a second terminal, and the capacitor C9B has a first terminal and a second terminal. The switch set SWC can control the electrical connection of the capacitor C7B, the capacitor C8B and the capacitor C9B with the feedback unit 204C, the first common mode voltage VCM_1, the first positive input signal $SIG_{IN\_P1}$ and the second common mode voltage VCM_2 to perform the sample operation, the prediction operation and the output operation.

The feedback unit 204D can include a feedback capacitor CF7B, a feedback capacitor CF8B and a feedback path control unit 241D. The feedback path control unit 241D can, in the sample operation, allow the feedback capacitor CF7B and the feedback capacitor CF8B to sample the second positive input signal $SIG_{IN\_P2}$, couple the feedback capacitor CF7B to a feedback path between the second output terminal OUT_N and the second positive input terminal IP2, and couple the feedback capacitor CF8B to the feedback path between the second output terminal OUT_N and the second positive input terminal IP2 in the output operation.

The correlated double sampling unit 206D includes a capacitor C10B, a capacitor C11B, a capacitor C12B and a switch set SWD. The capacitor C10B has a first terminal and a second terminal, wherein the first terminal of the capacitor C10B is coupled to the second positive input terminal IP2. The capacitor C11B has a first terminal and a second terminal, and the capacitor C12B has a first terminal and a second terminal. The switch set SWD can control the electrical connection of the capacitor C10B, the capacitor C11B and the capacitor C12B with the feedback unit 204D, the third common mode voltage VCM_3, the second positive input signal $SIG_{IN\_P2}$ and the fourth common mode voltage VCM_4 to perform the sample operation, the prediction operation and the output operation.

In the present embodiment, the first common mode voltage VCM_1 can be greater than the third common mode voltage VCM_3, and the second common mode voltage VCM_2 can be greater than the fourth common mode voltage VCM_4. The second common mode voltage VCM_2 can be the common mode voltage of the first positive input signal $SIG_{IN\_P1}$ and the first the negative input signal $SIG_{IN\_N1}$, and the fourth common mode voltage VCM_4 can be the common mode voltage of the second positive input signal $SIG_{IN\_P2}$ and the second negative input signal $SIG_{IN\_N2}$.

Figure 7:
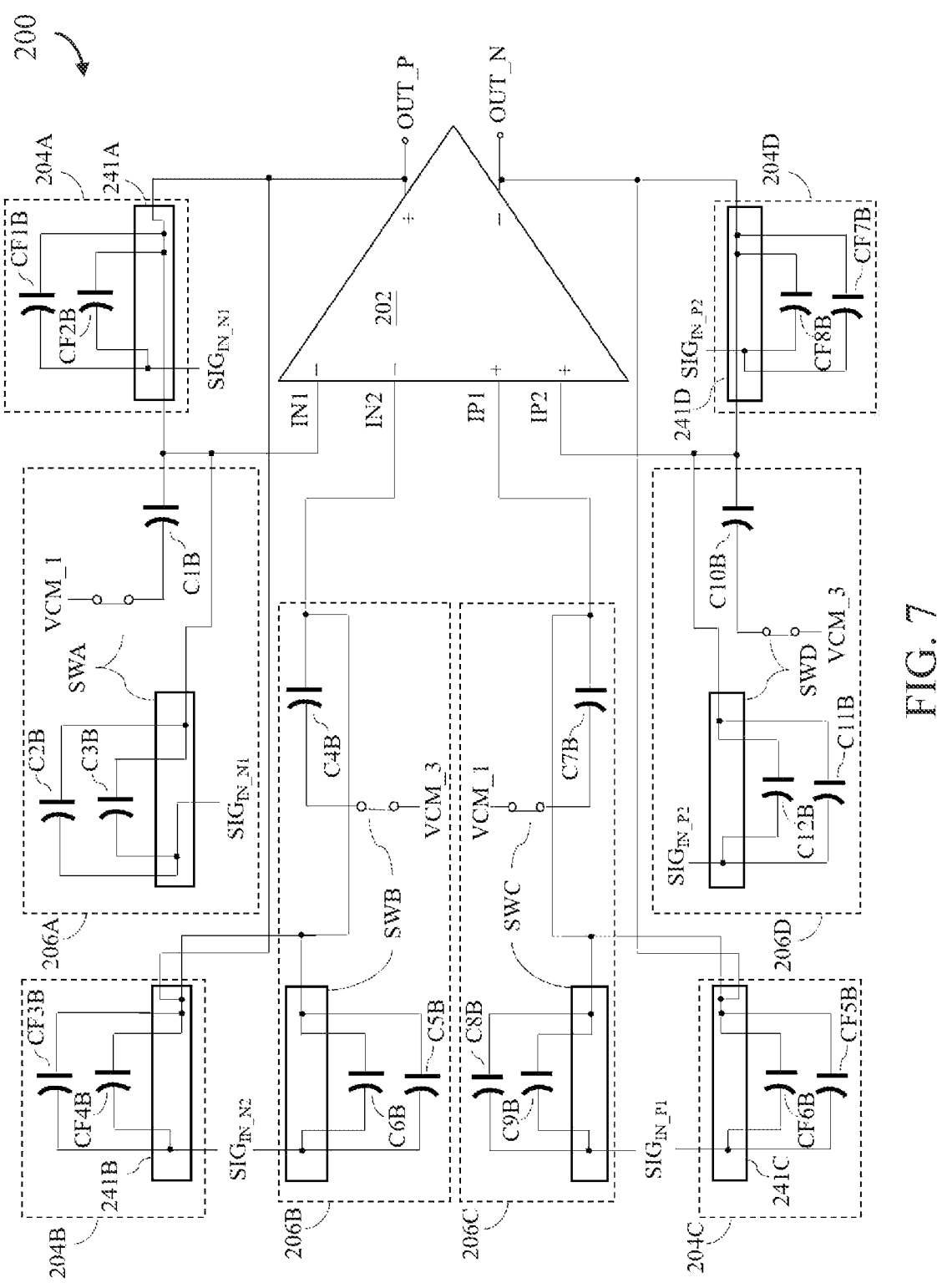
FIG. 7 is a schematic diagram illustrating the amplification circuit of FIG. 6 during a sample operation.
Figure 8:
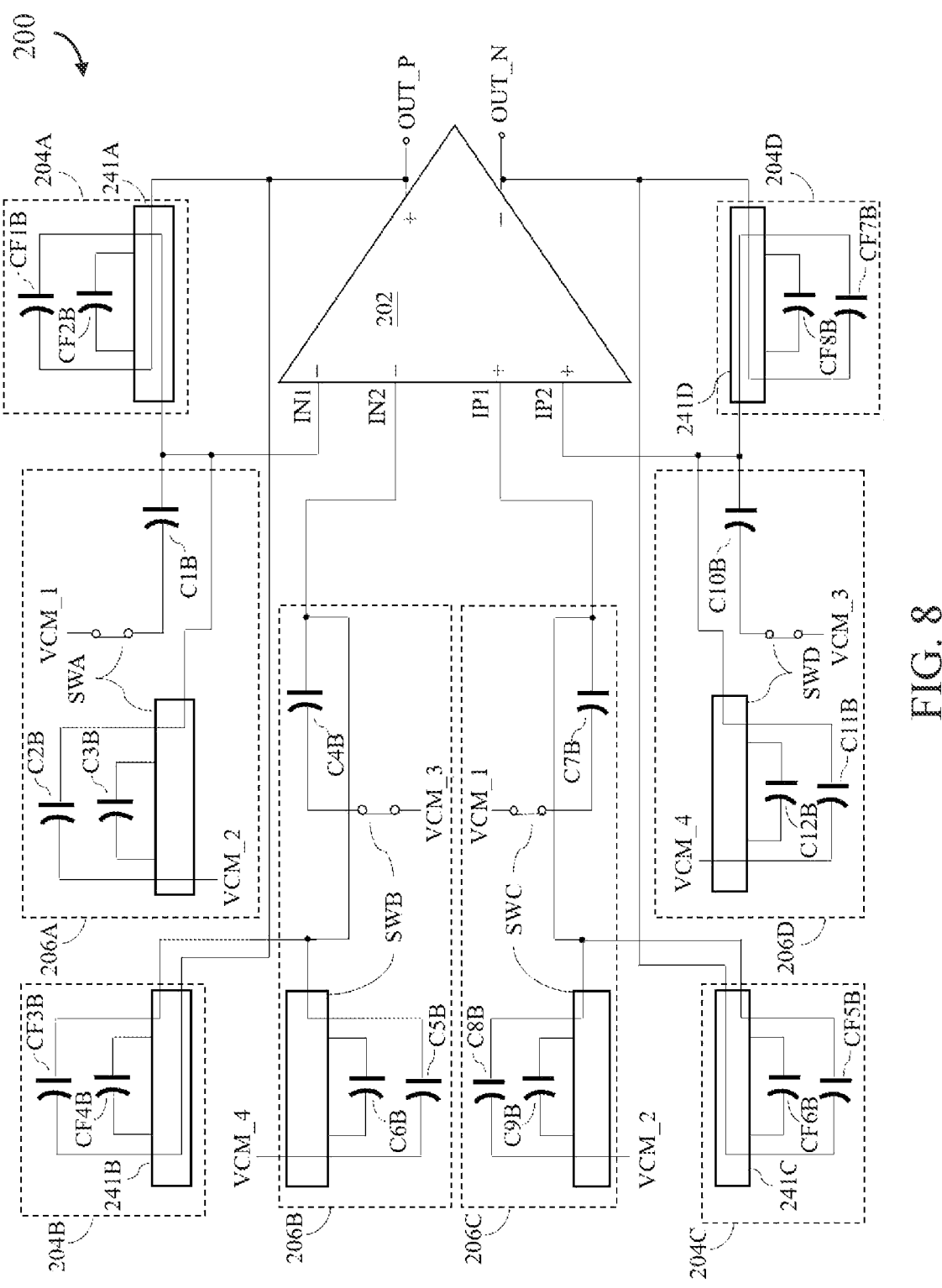
FIG. 8 is a schematic diagram illustrating the amplification circuit of FIG. 6 during a prediction operation.
Figure 9:
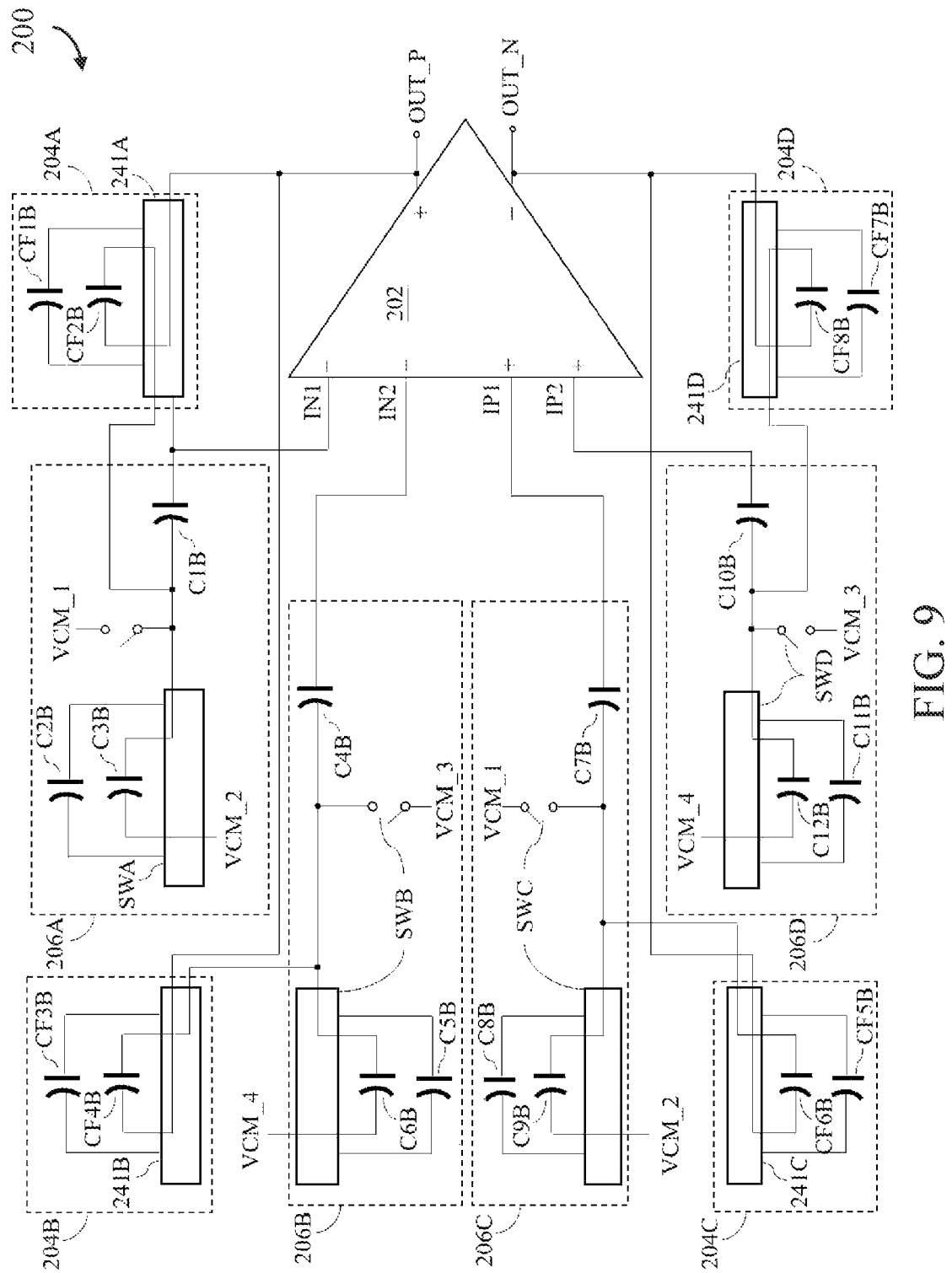
FIG. 9 is a schematic diagram illustrating the amplification circuit of FIG. 6 during an output operation.

The amplification circuit 200 can control the coupling relationship of the capacitors of the correlated double sampling units 206A, 206B, 206C and 206D with other components via the switch sets SWA, SWB, SWC and SWD, thereby completing the operation of the correlated double sampling. FIG. 7 is a schematic diagram illustrating the amplification circuit 200 during the sample operation, FIG. 8 is a schematic diagram illustrating the amplification circuit 200 during the prediction operation, and FIG. 9 is a schematic diagram illustrating the amplification circuit 200 during the output operation. It should be noted that not all switches of the switch sets SWA, SWB, SWC and SWD are illustrated in FIG. 6 for the sake of brevity; however, the designer can correspondingly arrange the required switches according the coupling relationship of each capacitor of the correlated double sampling units 206A, 206B, 206C and 206D with the other components as discussed in FIG. 7, FIG. 8 and FIG. 9.

As shown in FIG. 7, in the sample operation, a feedback path control unit 204A can short-circuit the first output terminal OUT_P and the first negative input terminal IN1, couple the first terminals of the feedback capacitor CF1B and the feedback capacitor CF2B to the first negative input terminal IN1 of the amplifier 202, and couple the second terminals of the feedback capacitor CF1B and the feedback capacitor CF2B to the first the negative input signal $SIG_{IN\_N1}$. Moreover, the switch set SWA can couple the first terminal of the capacitor C1B to the first negative input terminal IN1, couple the second terminal of the capacitor C1B to the first common mode voltage VCM_1, couple the first terminals of the capacitor C2B and the capacitor C3B to the first terminal of the capacitor C1B, and have the second terminals of the capacitor C2B and the capacitor C3B receive the first the negative input signal $SIG_{IN\_N1}$.

Next, as shown in FIG. 8, in the prediction operation, the feedback path control unit 204A can couple the first terminal of the feedback capacitor CF1B to the first negative input terminal IN1 of the amplifier 202, and couple the second terminal of the feedback capacitor CF1B to the first output terminal OUT_P of the amplifier 202. The switch set SWA can couple the second terminal of the capacitor C1B to the first common mode voltage VCM_1, couple the first terminal of the capacitor C2B to the first terminal of the capacitor C1B, and have the second terminal of the capacitor C2B receive the second common mode voltage VCM_2. In the prediction operation, the capacitor C1B can be configured to record the offset voltage of the amplifier 202.

After completing the prediction operation, as shown in FIG. 9, in the output operation, the feedback path control unit 204A can couple the first terminal of the feedback capacitor CF2B to the second terminal of the capacitor C1B, and couple the second terminal of the feedback capacitor CF2B to the first output terminal OUT_P of the amplifier 202. The switch set SWA couples the first terminal of the capacitor C3B to the second terminal of the capacitor C1B, and has the second terminal of the capacitor C3B receive the second common mode voltage VCM_2. In such case, the voltage of the input signal sampled by the capacitor CF2B in the sample operation can be compensated with the offset voltage recorded by the capacitor C1B in the prediction operation with each other, thereby reducing the efficiency deterioration of the amplifier 202 due to the offset voltage.

Similarly, as shown in FIG. 7, the feedback path control unit 204B can short-circuit the first output terminal OUT_P and the second negative input terminal IN2, couple the first terminals of the feedback capacitor CF3B and the feedback capacitor CF4B to the second negative input terminal IN2 of the amplifier 202, and couple the second terminals of the feedback capacitor CF3B and the feedback capacitor CF4B to the second negative input signal $SIG_{IN\_N2}$. The switch set SWB can couple the first terminal of the capacitor C4B to the second negative input terminal IN2, couple the second terminal of the capacitor C4B to the third common mode voltage VCM_3, couple the first terminals of the capacitor C5B and the capacitor C6B to the first terminal of the capacitor C4B, and have the second terminals of the capacitor C5B and the capacitor C6B receive the second negative input signal $SIG_{IN\_N2}$.

Next, as shown in FIG. 8, in the prediction operation, the feedback path control unit 204B can couple the first terminal of the feedback capacitor CF3B to the second negative input terminal IN2 of the amplifier 202, and couple the second terminal of the feedback capacitor CF3B to the first output terminal OUT_P of the amplifier 202. The switch set SWB can couple the second terminal of the capacitor C4B to the third common mode voltage VCM_3, couple the first terminal of the capacitor C5B to the first terminal of the capacitor C4B, and have the second terminal of the capacitor C5B receive the fourth common mode voltage VCM_4. In the prediction operation, the capacitor C4B can be configured to record the offset voltage of the amplifier 202.

After completing the prediction operation, as shown in FIG. 9, in the output operation, the feedback path control unit 204B can couple the first terminal of the feedback capacitor CF4B to the second terminal of the capacitor C4B, and couple the second terminal of the feedback capacitor CF4B to the first output terminal OUT_P of the amplifier 202. The switch set SWB couples the first terminal of the capacitor C6B to the second terminal of the capacitor C4B, and has the second terminal of the capacitor C6B receive the fourth common mode voltage VCM_4. In such case, the voltage of the input signal sampled by the capacitor CF4B in the sample operation can be compensated with the offset voltage recorded by the capacitor C4B in the prediction operation, thereby reducing the efficiency deterioration of amplifier 202 due to the offset voltage.

Similarly, the feedback path control unit 204C and the correlated double sampling unit 206C can also control the feedback capacitors CF5B and CF6B and the capacitors C7B, C8B and C9B according to the operations in FIG. 7 to FIG. 9 to perform the sample operation and the output operation, and the feedback path control unit 204D and the correlated double sampling unit 206D can also control the feedback capacitors CF7B and CF8B and the capacitors C10B, C11B and C12B according to the operations in FIG. 7 to FIG. 9 to perform the sample operation and the output operation.

Moreover, in the embodiment of FIG. 6, the amplification circuit 200 can include four feedback units 204A, 204B, 204C and 204D and four correlated double sampling units 206A, 206B, 206C and 206D, however, the present disclosure is not limited there to, and in some other embodiments, the amplifier 202 can be further coupled to a single-ended conversion circuit to change the double-ended output of the amplifier 202 to a single-ended output. In such case, the amplification circuit 200 can sample and compensate the bias via only the first negative input terminal IN1 and the second negative input terminal IN2 depending on the needs, and may omit the feedback units 204C, 204D and the correlated double sampling units 206C and 206D.

In view of the foregoing, the amplifier circuit of the present disclosure can use different feedback units and different correlated double sampling units to perform correlated double sample operations on different input terminals, so the situation where multiple capacitors are connected in series on the same path can be avoided, thereby compensating the offset voltage of the amplifier more effectively and improving the overall performance of the amplifier circuit.

What is claimed is:

1. An amplification circuit, comprising:
an amplifier, having a first positive input terminal, a second positive input terminal, a first negative input terminal, a second negative input terminal and a first output terminal;
a first feedback unit, having a first terminal coupled to the first output terminal, and a second terminal;
a second feedback unit, having a first terminal coupled to the first output terminal, and a second terminal;
a first correlated double sampling unit, comprising:
a first capacitor, having a first terminal coupled to the first negative input terminal, and a second terminal;
a second capacitor, having a first terminal coupled to the second terminal of the first capacitor, and a second terminal; and
a first switch set, configured to control the electrical connection of the first capacitor and the second capacitor with the second terminal of the first feedback unit, a first common mode voltage, a first negative input signal and a second common mode voltage, to perform a sample operation and an output operation; and a second correlated double sampling unit, comprising:

a third capacitor, having a first terminal coupled to the second negative input terminal, and a second terminal;

a fourth capacitor, having a first terminal coupled to the second terminal of the third capacitor, and a second terminal; and a second switch set, configured to control the electrical connection of the third capacitor and the fourth capacitor with the second terminal of the second feedback unit, a third common mode voltage, a second negative input signal and a fourth common mode voltage, to perform the sample operation and the output operation.

2. The amplification circuit of claim 1, wherein:

in the sample operation:

the first switch set couples the first terminal of the first capacitor to the second terminal of the first feedback unit, couples the second terminal of the first capacitor to the first common mode voltage, and has the second terminal of the second capacitor receive the first negative input signal; and the second switch set couples the first terminal of the third capacitor to the second terminal of the second feedback unit, couples the second terminal of the third capacitor to the third common mode voltage, and has the second terminal of the fourth capacitor receive the second negative input signal; and in an output operation:

the first switch set disconnects the first terminal of the first capacitor and the second terminal of the first feedback unit, couples the second terminal of the first capacitor to the second terminal of the first feedback unit, and has the second terminal of the second capacitor receive the second common mode voltage; and the second switch set disconnects the first terminal of the third capacitor and the second terminal of the second feedback unit, couples the second terminal of the third capacitor to the second terminal of the second feedback unit, and has the second terminal of the fourth capacitor receive the fourth common mode voltage.

3. The amplification circuit of claim 1, wherein the first switch set comprises:

a first switch, having a first terminal coupled to the first terminal of the first capacitor, and a second terminal coupled to the second terminal of the first feedback unit;

a second switch, having a first terminal coupled to the second terminal of the first capacitor, and a second terminal coupled to the second terminal of the first feedback unit;

a third switch, having a first terminal coupled to the second terminal of the first capacitor, and a second terminal coupled to the first common mode voltage;

a fourth switch, having a first terminal coupled to the second terminal of the second capacitor, and a second terminal coupled to the second common mode voltage; and a fifth switch, having a first terminal coupled to the second terminal of the second capacitor, and a second terminal coupled to the first negative input voltage.

4. The amplification circuit of claim 3, wherein:

in the sample operation, the first switch, the third switch and the fifth switch are turned on, and the second switch and the fourth switch are turned off; and in the output operation, the first switch, the third switch and the fifth switch are turned off, and the second switch and the fourth switch are turned on.

5. The amplification circuit of claim 1, wherein the amplifier further comprises a second output terminal, and the amplification circuit further comprises:

a third feedback unit, having a first terminal coupled to the second output terminal, and a second terminal;

a fourth feedback unit, having a first terminal coupled to the second output terminal, and a second terminal;

a third correlated double sampling unit, comprising:

a fifth capacitor, having a first terminal coupled to the first positive input terminal, and a second terminal;

a sixth capacitor, having a first terminal coupled to the second terminal of the fifth capacitor, and a second terminal; and a third switch set, configured to control the electrical connection of the fifth capacitor and the sixth capacitor with the second terminal of the third feedback unit, the first common mode voltage, a first positive input signal and the second common mode voltage to perform the sample operation and the output operation; and a fourth correlated double sampling unit, comprising:

a seventh capacitor, having a first terminal coupled to the second positive input terminal, and a second terminal;

an eighth capacitor, having a first terminal coupled to the second terminal of the seventh capacitor, and a second terminal; and a fourth switch set, configured to control the electrical connection of the seventh capacitor and the eighth capacitor with the second terminal of the fourth feedback unit, the third common mode voltage, a second positive input signal and the fourth common mode voltage to perform the sample operation and the output operation.

6. The amplification circuit of claim 5, wherein the second common mode voltage is the common mode voltage of the first positive input signal and the first negative input signal, and the fourth common mode voltage is the common mode voltage of the second positive input signal and the second negative input signal.

7. The amplification circuit of claim 1, wherein the amplifier comprises:

a positive terminal P-type transistor, having a source, a drain coupled to the first output terminal of the amplifier, and a gate coupled to the first positive input terminal of the amplifier;

a negative terminal P-type transistor, having a source, a drain coupled to the second output terminal of the amplifier, and a gate coupled to the first negative input terminal of the amplifier;

a positive terminal N-type transistor, having a source, a drain coupled to the drain of the positive terminal P-type transistor, and a gate coupled to of the amplifier the second positive input terminal; and a negative terminal N-type transistor, having a source, a drain coupled to the drain of the negative terminal P-type transistor, and a gate coupled to the second negative input terminal of the amplifier;

wherein the first negative input signal and the second negative input signal have a same value, and the first positive input signal and the second positive input signal have a same value.

8. The amplification circuit of claim 7, wherein the first common mode voltage is greater than the third common mode voltage, and the second common mode voltage is greater than the fourth common mode voltage.

9. The amplification circuit of claim 7, wherein the positive terminal P-type transistor and the positive terminal N-type transistor are stacked between a first reference voltage and a second reference voltage, and the negative terminal P-type transistor and the negative terminal N-type transistor are stacked between the first reference voltage and the second reference voltage.

10. The amplification circuit of claim 1, wherein the first feedback unit comprises a first feedback capacitor, and the second feedback unit comprises a second feedback capacitor.

11. An amplification circuit, comprising:

an amplifier, having a first positive input terminal, a second positive input terminal, a first negative input terminal, a second negative input terminal and a first output terminal;

a first feedback unit, comprising a first feedback capacitor, a second feedback capacitor and a first feedback path control unit, wherein the first feedback path control unit is configured to, in a sample operation, has the first feedback capacitor and the second feedback capacitor sample a first negative input signal, and in a prediction operation and an output operation, respectively couple the first feedback capacitor and the second feedback capacitor to a feedback path between the first output terminal and the first negative input terminal;

a second feedback unit, comprising a third feedback capacitor, a fourth feedback capacitor and a second feedback path control unit, wherein the second feedback path control unit is configured to, in the sample operation, has the third feedback capacitor and the fourth feedback capacitor sample a second negative input signal, and in the prediction operation and the output operation, respectively couple the third feedback capacitor and the fourth feedback capacitor to a feedback path between the first output terminal and the second negative input terminal;

a first correlated double sampling unit, comprising:

a first capacitor, having a first terminal coupled to the first negative input terminal, and a second terminal;

a second capacitor, having a first terminal and a second terminal;

a third capacitor, having a first terminal and a second terminal; and a first switch set, configured to control the electrical connection of the first capacitor, the second capacitor and the third capacitor with the first feedback unit, a first common mode voltage, the first negative input signal and a second common mode voltage to perform the sample operation, the prediction operation and the output operation; and a second correlated double sampling unit, comprising:

a fourth capacitor, having a first terminal coupled to the second negative input terminal, and a second terminal;

a fifth capacitor, having a first terminal and a second terminal;

a sixth capacitor, having a first terminal and a second terminal; and a second switch set, configured to control the electrical connection of the fourth capacitor, the fifth capacitor and the sixth capacitor with the second feedback unit, a third common mode voltage, the second negative input signal and a fourth common mode voltage to perform the sample operation, the prediction operation and the output operation.

12. The amplification circuit of claim 11, wherein:

in the sample operation:

the first feedback path control unit short-circuits the first output terminal and the first negative input terminal, couples the first terminals of the first feedback capacitor and the second feedback capacitor to the first negative input terminal of the amplifier, and couples the second terminals of the first feedback capacitor and the second feedback capacitor to the first negative input signal;

the second feedback path control unit short-circuits the first output terminal and the second negative input terminal, couples the first terminals of the third feedback capacitor and the fourth feedback capacitor to the second negative input terminal of the amplifier, and couples the second terminals of the third feedback capacitor and the fourth feedback capacitor to the second negative input signal;

the first switch set couples the second terminal of the first capacitor to the first common mode voltage, couples and the first terminals of the second capacitor the third capacitor to the first terminal of the first capacitor, and has the second capacitor and the second terminal of the third capacitor receive the first negative input signal; and the second switch set couples the second terminal of the fourth capacitor to the third common mode voltage, couples the first terminals of the fifth capacitor and the sixth capacitor to the first terminal of the fourth capacitor, and has the second terminals of the fifth capacitor and the sixth capacitor receive the second negative input signal.

13. The amplification circuit of claim 11, wherein:

in the prediction operation:

the first feedback path control unit couples the first terminal of the first feedback capacitor to the first negative input terminal of the amplifier, and couples the second terminal of the first feedback capacitor to the first output terminal of the amplifier;

the second feedback path control unit couples the first terminal of the third feedback capacitor to the second negative input terminal of the amplifier, and couples the second terminal of the third feedback capacitor to the first output terminal of the amplifier;

the first switch set couples the second terminal of the first capacitor to the first common mode voltage, couples the first terminal of the second capacitor to the first terminal of the first capacitor, and has the second terminal of the second capacitor receive the second common mode voltage; and the second switch set couples the second terminal of the fourth capacitor to the third common mode voltage, couples the first terminal of the fifth capacitor to the first terminal of the fourth capacitor, and has the second terminal of the fifth capacitor receive the fourth common mode voltage.

14. The amplification circuit of claim 11, wherein:

in the output operation:

the first feedback path control unit couples the first terminal of the second feedback capacitor to the second terminal of the first capacitor, and couples the second terminal of the second feedback capacitor to the first output terminal of the amplifier;

the second feedback path control unit couples the first terminal of the fourth feedback capacitor to the second terminal of the fourth capacitor, and couples the second terminal of the fourth feedback capacitor to the first output terminal of the amplifier;

the first switch set couples the first terminal of the third capacitor to the second terminal of the first capacitor, and has the second terminal of the third capacitor receive the second common mode voltage; and the second switch set couples the first terminal of the sixth capacitor to the second terminal of the fourth capacitor, and has the second terminal of the sixth capacitor receive the fourth common mode voltage.

15. The amplification circuit of claim 11, wherein the amplifier further comprises a second output terminal, and the amplification circuit further comprises:

a third feedback unit, comprising a fifth feedback capacitor, a sixth feedback capacitor and a third feedback path control unit, wherein the third feedback path control unit is configured to, in the sample operation, have the fifth feedback capacitor and the sixth feedback capacitor sample a first positive input signal, and in the prediction operation and the output operation, respectively couple the fifth feedback capacitor and the sixth feedback capacitor to a feedback path between the second output terminal and the first positive input terminal;

a fourth feedback unit, comprising a seventh feedback capacitor, an eighth feedback capacitor and a fourth feedback path control unit, wherein the fourth feedback path control unit is configured to, in the sample operation, have the seventh feedback capacitor and the eighth feedback capacitor sample a second positive input signal, and in the prediction operation and the output operation, respectively couple the seventh feedback capacitor and the eighth feedback capacitor to a feedback path between the second output terminal and the second positive input terminal;

a third correlated double sampling unit, comprising:

a seventh capacitor, having a first terminal coupled to the first positive input terminal, and a second terminal;

an eighth capacitor, having a first terminal and a second terminal;

a ninth capacitor, having a first terminal and a second terminal;

a third switch set, configured to control the electrical connection of the seventh capacitor, the eighth capacitor and the ninth capacitor with the third feedback unit, the first common mode voltage, the first positive input signal and the second common mode voltage to perform the sample operation, the prediction operation and the output operation; and a fourth correlated double sampling unit, comprising:

a tenth capacitor, having a first terminal coupled to the second positive input terminal, and a second terminal;

an eleventh capacitor, having a first terminal and a second terminal;

a twelfth capacitor, having a first terminal and a second terminal;

a second switch set, configured to control the electrical connection of the tenth capacitor, the eleventh capacitor and the twelfth capacitor with the fourth feedback unit, the third common mode voltage, the second positive input signal and the fourth common mode voltage to perform the sample operation, the prediction operation and the output operation.

16. The amplification circuit of claim 15, wherein the second common mode voltage is the common mode voltage of the first positive input signal and the first negative input signal, and the fourth common mode voltage is the common mode voltage of the second positive input signal and the second negative input signal.

17. The amplification circuit of claim 11, wherein the amplifier comprises:

a positive terminal P-type transistor, having a source, a drain coupled to the first output terminal of the amplifier, and a gate coupled to the first positive input terminal of the amplifier;

a negative terminal P-type transistor, having a source, a drain coupled to the second output terminal of the amplifier, and a gate coupled to the first negative input terminal of the amplifier;

a positive terminal N-type transistor, having a source, a drain coupled to of the positive terminal P-type transistor the drain, and a gate coupled to the second positive input terminal of the amplifier; and a negative terminal N-type transistor, having a source, a drain coupled to the drain of the negative terminal P-type transistor, and a gate coupled to the second negative input terminal of the amplifier.

18. The amplification circuit of claim 17, wherein the first common mode voltage is greater than the third common mode voltage, and the second common mode voltage is greater than the fourth common mode voltage.

19. The amplification circuit of claim 17, wherein the positive terminal P-type transistor and the positive terminal N-type transistor are stacked between a first reference voltage and a second reference voltage, and the negative terminal P-type transistor and the negative terminal N-type transistor are stacked between the first reference voltage and the second reference voltage.

20. The amplification circuit of claim 11, wherein:

the prediction operation is performed after the sample operation is completed, and the output operation is performed after the prediction operation is completed; and the first negative input signal and the second negative input signal have a same value, and the first positive input signal and the second positive input signal have a same value.

* * * * *